(12) United States Patent
Takahashi

(10) Patent No.: US 9,177,850 B2
(45) Date of Patent: Nov. 3, 2015

(54) SUBSTRATE CARRYING MECHANISM, SUBSTRATE PROCESSING APPARATUS, AND SEMICONDUCTOR DEVICE MANUFACTURING METHOD

(75) Inventor: Akira Takahashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 922 days.

(21) Appl. No.: 13/225,489

(22) Filed: Sep. 5, 2011

(65) Prior Publication Data

US 2012/0064734 A1 Mar. 15, 2012

(30) Foreign Application Priority Data

Sep. 14, 2010 (JP) ................................ 2010-206034
Jun. 15, 2011 (JP) ................................ 2011-133316

(51) Int. Cl.
*H01L 21/687* (2006.01)
*H01L 21/673* (2006.01)

(52) U.S. Cl.
CPC ...... *H01L 21/68707* (2013.01); *H01L 21/6875* (2013.01); *H01L 21/67383* (2013.01)

(58) Field of Classification Search
USPC .............................. 414/744.1–744.8; 294/213
See application file for complete search history.

(56) References Cited

U.S. PATENT DOCUMENTS

| 6,409,453 | B1* | 6/2002 | Brodine et al. .......... 414/416.01 |
| 2003/0173790 | A1* | 9/2003 | Hartog .......................... 294/64.1 |
| 2004/0113444 | A1 | 6/2004 | Blonigan et al. |
| 2005/0006916 | A1 | 1/2005 | Mantz |
| 2007/0227033 | A1 | 10/2007 | Kobayashi et al. |
| 2008/0131237 | A1* | 6/2008 | van der Meulen ............ 414/217 |
| 2009/0110532 | A1* | 4/2009 | Salek ............................ 414/757 |
| 2010/0178137 | A1* | 7/2010 | Chintalapati et al. .... 414/222.01 |

(Continued)

FOREIGN PATENT DOCUMENTS

| JP | 6-127621 | 5/1994 |
| JP | 2001-168179 | 6/2001 |
| JP | 2006-510559 | 3/2006 |

(Continued)

OTHER PUBLICATIONS

Korean Office Action dated Sep. 1, 2013 for the corresponding Korean Patent Application.

(Continued)

*Primary Examiner* — Saul Rodriguez
*Assistant Examiner* — Ronald Jarrett
(74) *Attorney, Agent, or Firm* — Solaris Intellectual Property Group PLLC

(57) ABSTRACT

The present invention provides a substrate carrying mechanism, a substrate processing apparatus, and a semiconductor device manufacturing method that, when carrying a substrate, suppress the generation of scratches and particles caused by substrate deformation, suppress a decrease in substrate holding force due to substrate deformation, and realizes stable high-speed carriage. Namely, the substrate carrying mechanism, the substrate processing apparatus, and the semiconductor device manufacturing method of the present invention include: a plate-like body that becomes a support base body of a substrate that is a carrying subject; and substrate support portions in which plural convex portions disposed on a surface of the plate-like body are placed on a circumference of a circle that is smaller than the diameter of the substrate.

14 Claims, 9 Drawing Sheets

(56) References Cited

U.S. PATENT DOCUMENTS

2010/0267317 A1* 10/2010 Takahashi et al. ............ 451/388
2012/0126555 A1    5/2012 Mantz

FOREIGN PATENT DOCUMENTS

| JP | 2007-169007 | 7/2007 |
| JP | 2007-184476 A | 7/2007 |
| JP | 2007-525001 | 8/2007 |
| JP | 2007-273620 | 10/2007 |
| JP | 2008-282870 | 11/2008 |
| JP | 2009-111406 | 5/2009 |
| WO | 2009/099107 | 8/2009 |

OTHER PUBLICATIONS

Japanese Office Action dated Dec. 13, 2012 for the corresponding Japanese Patent Application.
Japanese Office Action mailed Jul. 9, 2013 for the corresponding Japanese Patent Application.
Korean Office Action dated Mar. 3, 2014 for the corresponding Korean Patent Application.
Korean Office Action dated Apr. 23, 2013 for the corresponding Korean Patent Application.
Japanese Office Action dated Sep. 19, 2012 for the corresponding Japanese Patent Application.

* cited by examiner

SUBSTRATE CARRYING MECHANISM, SUBSTRATE PROCESSING APPARATUS, AND SEMICONDUCTOR DEVICE MANUFACTURING METHOD

CROSS-REFERENCE TO RELATED APPLICATION

This application claims priority under 35 USC 119 from Japanese Patent Application No. 2010-206034, filed on Sep. 14, 2010, and No. 2011-133316, filed on Jun. 15, 2011, the disclosures of which are incorporated by reference herein.

BACKGROUND OF THE INVENTION

1. Field of the Invention

The present invention relates to a substrate carrying mechanism that supports a substrate that is a carrying subject, a substrate processing apparatus that is equipped with the substrate carrying mechanism, and a semiconductor device manufacturing method that is performed by using the substrate processing apparatus.

2. Description of the Related Art

Generally, substrate processing apparatus used in a semiconductor device manufacturing process are equipped with a processing chamber and a carrying device. The processing chamber processes substrates such as wafers. The carrying device carries the substrates into the processing chamber, and carries the substrates out from the processing chamber. The carrying device is equipped with a substrate carrying mechanism called tweezers. The substrate carrying mechanism supports the substrates that are the carrying subjects. For example, Japanese Patent Application Laid-Open (JP-A) No. 2007-184476 discloses such carrying mechanism. This substrate carrying mechanism is configured such that a stepwise support portion is formed on a two-pronged fork-like plate-like body called a finger plate, and the support portion supports four places in the neighboring portions of the outer peripheral edge of the substrate from the back surface side of a surface of the substrate that undergoes processing.

However, in the substrate carrying mechanism described in JP-A No. 2007-184476, in a case when deformation, such as warping and bending, has occurred in the substrate, the substrate contacts at places outside the support portion, and rubbing occur due to a decrease in the force to hold the substrate by the support portion (frictional force between the substrate and the support portion). Such contact and rubbing may lead to the generation of scratches and particles. Further, when deformation has occurred in the substrate, the contact area between a support member and the substrate decreases, and the substrate holding force decreases. When the substrate holding force decreases, carrying capability of the substrate decreases.

SUMMARY OF THE INVENTION

The present invention provides a substrate carrying mechanism, a substrate processing apparatus, and a semiconductor device manufacturing method that suppress the generation of scratches and particles resulting from substrate deformation, suppress a decrease in substrate holding force due to substrate deformation, and realizes stable high-speed carriage.

A first aspect of the present invention is a substrate carrying mechanism including: a plate-like body that becomes a support base body of a substrate that is a carrying subject; and substrate support portions in which plural convex portions disposed on a surface of the plate-like body are placed on a circumference of a circle that is smaller than the diameter of the substrate.

A second aspect of the present invention is a substrate processing apparatus including: a processing chamber that processes a substrate; and a carrying device that carries the substrate to the processing chamber, wherein the carrying device includes, a substrate carrying mechanism that supports the substrate, and a carrying mechanism moving member that moves the substrate carrying mechanism, and the carrying mechanism includes, a plate-like body that becomes a support base body of the substrate that is a carrying subject, and substrate support portions in which plural convex portions disposed on a surface of the plate-like body are placed on a circumference of a circle that is smaller than the diameter of the substrate.

A third aspect of the present invention is a semiconductor device manufacturing method performed using a substrate processing apparatus configured to include a processing chamber that processes a substrate, and a carrying device that carries the substrate to the processing chamber, the method including: a substrate supplying step in which the carrying device carries the substrate into the processing chamber; a processing step of processing the substrate in the processing chamber; and a substrate out-carrying step in which the carrying device carries the substrate out from the processing chamber, wherein in at least one of the substrate supplying step and the substrate out-carrying step, a supported surface of the substrate that is a carrying subject is supported by substrate support portions in which plural convex portions are placed on a circumference of a circle that is smaller than the diameter of the substrate.

According to the above aspects of the present invention, the occurrence of scratches and particles may be suppressed even when deformation has occurred in the substrate, compared to the conventional configuration that supports the substrate only in the neighboring portions of the outer peripheral edge of the substrate. Moreover, the above-described aspects of the present invention may suppress a decrease in substrate holding force due to substrate deformation, and may realize stable high-speed carriage.

BRIEF DESCRIPTION OF THE DRAWINGS

An exemplary embodiment of the present invention will be described in detail based on the following figures, wherein.

DETAILED DESCRIPTION OF THE INVENTION

Exemplary Embodiment

An exemplary embodiment of the present invention will be described below with reference to the drawings. With respect to embodiments of the invention disclosed herein, the term "convex" means projecting upward when seen in a cross-sectional view, and can refer to shapes having flat top surfaces. Further, the term "concave" means recessed when seen in a cross-sectional view, and can refer to shapes having flat bottom surfaces.

(1) Configuration of Substrate Processing Apparatus

First, an example configuration of a substrate processing apparatus according to the exemplary embodiment of the present invention will be described. Here, a case where the substrate processing apparatus is an ashing apparatus that performs resist removal will be taken as an example.

Figure 1:
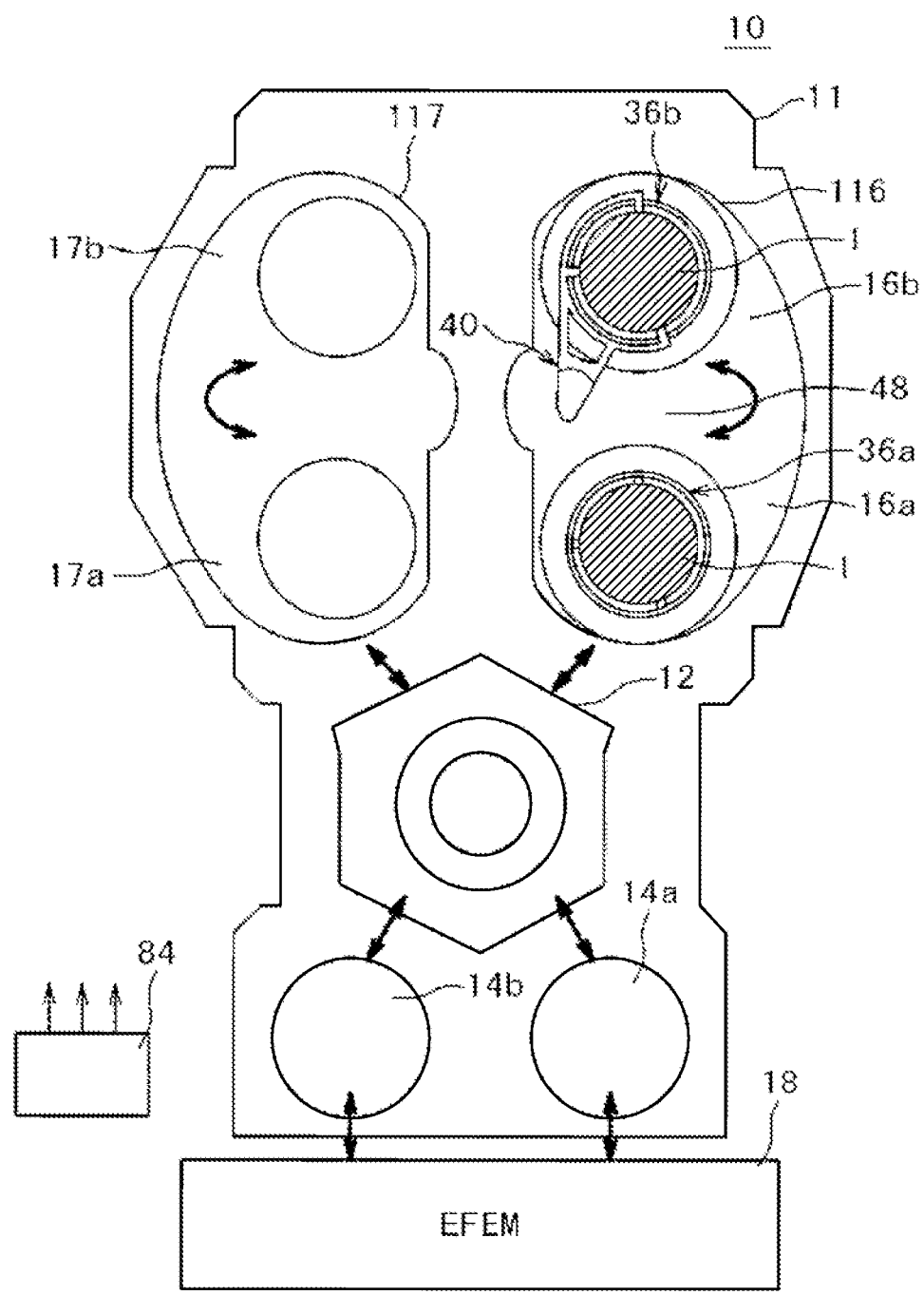
FIG. 1 is a schematic configuration diagram of a substrate processing apparatus according to the exemplary embodiment of the present invention.
Figure 2:
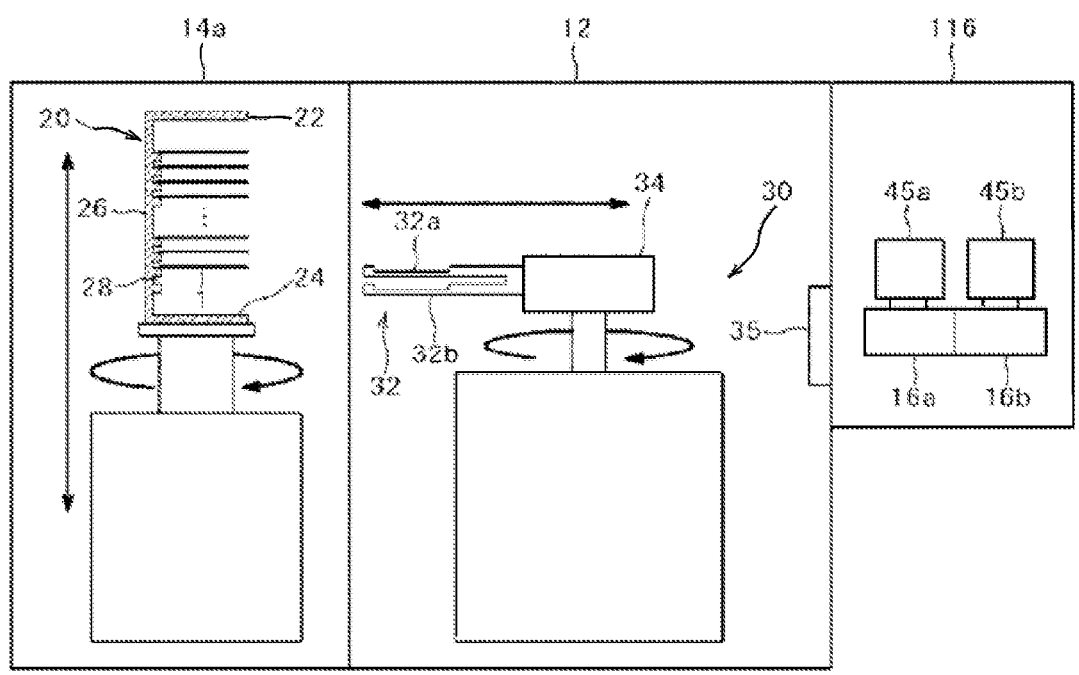
FIG. 2 is a vertical sectional view of the substrate processing apparatus shown in FIG. 1.
Figure 3:
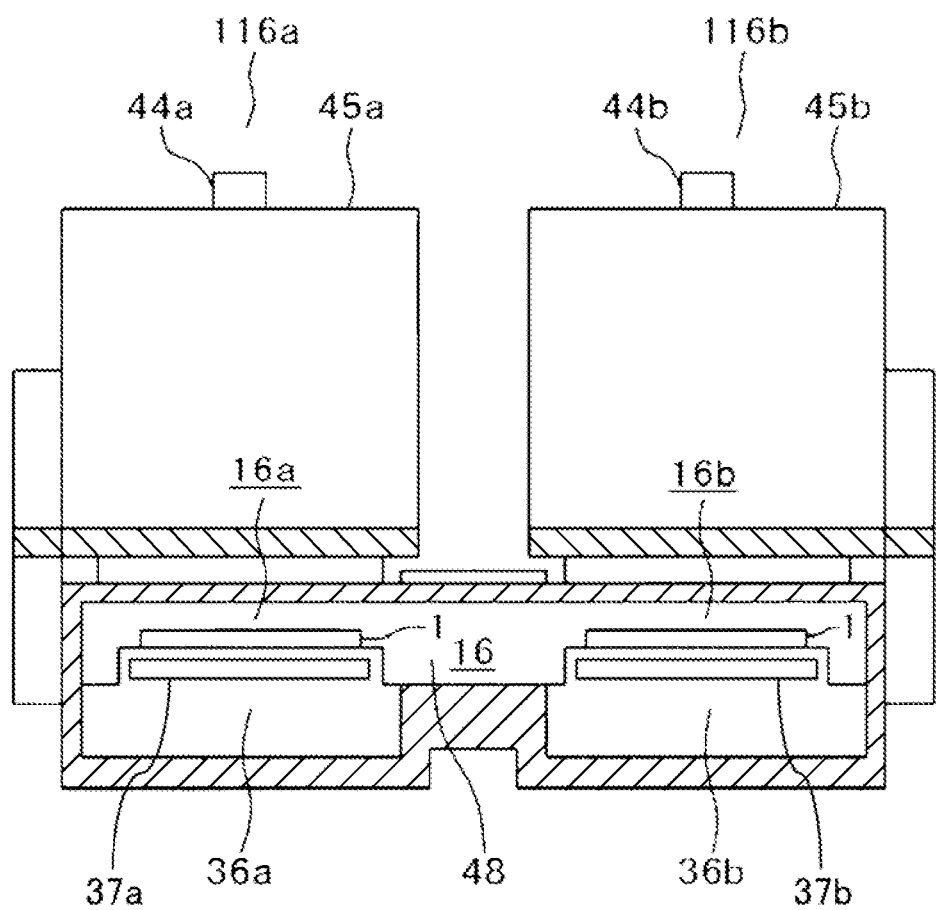
FIG. 3 is a vertical sectional view of the inside of a processing chamber group of the substrate processing apparatus shown in FIG. 1.
Figure 4:
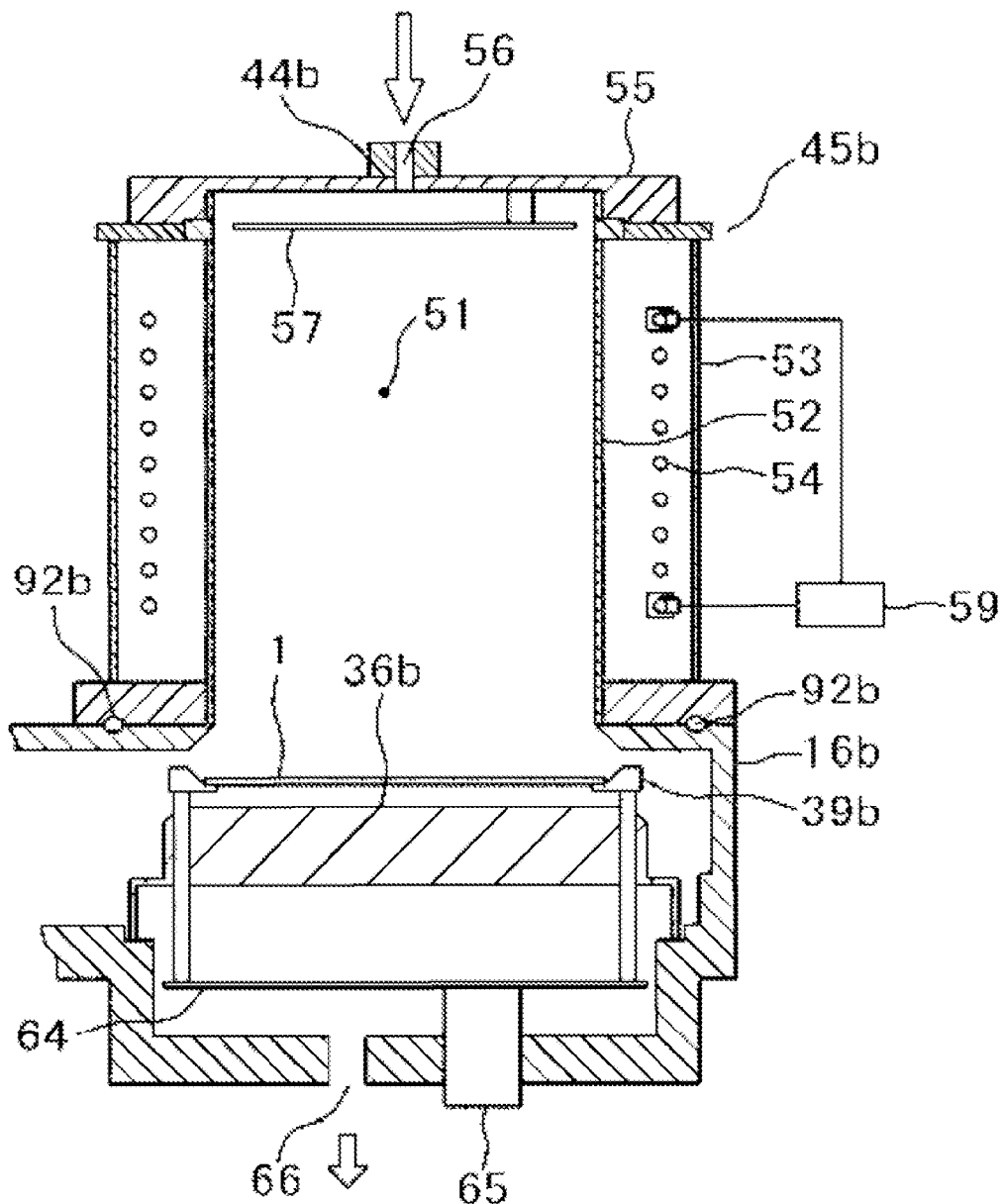
FIG. 4 is a vertical sectional view of an upper processing chamber and a lower processing chamber of the substrate processing apparatus shown in FIG. 1.

FIG. 1 is a schematic configuration diagram of a substrate processing apparatus according to the exemplary embodiment of the present invention. FIG. 2 is a vertical sectional view of the substrate processing apparatus shown in FIG. 1. FIG. 3 is a vertical sectional view of the inside of a processing chamber group of the substrate processing apparatus shown in FIG. 1. FIG. 4 is a vertical sectional view of an upper processing chamber and a lower processing chamber of the substrate processing apparatus shown in FIG. 1.

As shown in FIG. 1, a substrate processing apparatus 10 according to the present exemplary embodiment is equipped with a casing 11, and a controller 84 that controls each configural part of the substrate processing apparatus 10.

Inside the casing 11, two load lock chambers 14a and 14b, and a first processing chamber group 116 and a second processing chamber group 117, are placed around a carrying chamber 12. A gate valve (not shown in the drawings) is disposed between the carrying chamber 12 and each of the load lock chambers 14a and 14b. The carrying chamber 12 and the load lock chambers 14a and 14b are configured to become communicable by opening the gate valves. Further, a gate valve (not shown in the drawings) is also disposed between the carrying chamber 12 and each of the processing chamber groups 116 and 117. The carrying chamber 12 and the processing chamber groups 116 and 117 are configured to become communicable by opening the gate valves.

Outside the casing 11, an EFEM (Equipment Front End Module) 18 that is a front module is placed to face the load lock chambers 14a and 14b. The EFEM 18 is configured to can load, for example, three FOUPs (Front End Unified Pods), each of which stacks twenty-five wafers that are substrates. Further, an atmospheric robot (not shown in the drawings), capable of transferring several (five) wafers simultaneously in the atmosphere, is mounted inside the EFEM 18. The atmospheric robot performs wafer transfer between the EFEM 18 and the load lock chambers 14a and 14b.

As shown in FIG. 2, a substrate support body (a boat) 20 that accommodates, for example, twenty-five wafers 1 with fixed intervals in its longitudinal direction, is disposed in each of the load lock chambers 14a and 14b. The wafers 1 are held in each of the load lock chambers 14a and 14b by this substrate support body 20. The substrate support body 20 is configured by, for example, silicon carbide or aluminium. The substrate support body 20 has, for example, three struts 26 that interconnect an upper portion plate 22 and a lower portion plate 24. Twenty-five, for example, mounting portions 28 are formed in parallel on the lengthwise direction inner sides of the struts 26. Further, the substrate support body 20 is configured to move in a vertical direction in the load lock chambers 14a and 14b. Together therewith, the substrate support body 20 is configured to rotate about an axis of rotation extending in the vertical direction (see the arrows in FIG. 2).

A robot 30 which is a carrying device that carries the wafers 1 between the load lock chambers 14a and 14b, and the first processing chamber group 116 and second processing chamber group 117, is disposed in the carrying chamber 12. The robot 30 is equipped with a substrate carrying mechanism 32 called tweezers, and an arm 34 that serves as a carrying mechanism moving member that moves the substrate carrying mechanism 32. The substrate carrying mechanism 32 is configured from upper tweezers 32a and lower tweezers 32b. The upper tweezers 32a and the lower tweezers 32b have the same shape, for example. The upper tweezers 32a and the lower tweezers 32b are spaced with a predetermined interval apart from each other in the vertical direction, and extend in the same direction substantially horizontally from the arm 34, and each supports a wafer 1 that is a carrying subject. Further, the arm 34 is configured to be rotatable about an axis of rotation extending in the vertical direction and movable in the horizontal direction (see the arrows in FIG. 2).

The carrying chamber 12 and the first processing chamber group 116 are communicated with each other via a gate valve 35. Consequently, the robot 30 in the carrying chamber 12 transfers, two wafers at a time simultaneously by the upper tweezers 32a and the lower tweezers 32b, the unprocessed wafers 1 stacked in the load lock chambers 14a and 14b into the first processing chamber group 116 via the gate valve 35. Further, the robot 30 in the carrying chamber 12 transfers, two wafers at a time by the upper tweezers 32a and the lower tweezers 32b, the processed wafers 1 from the first processing chamber group 116 into the load lock chambers 14a and 14b. Further, it is also the same regarding the second processing chamber group 117: the robot 30 in the carrying chamber 12 transfers, two wafers at a time simultaneously, the unprocessed wafers 1 in the load lock chambers 14a and 14b into the second processing chamber group 117 via the gate valve 35. Moreover, the robot 30 in the carrying chamber 12 transfers, two at a time, the processed wafers 1 from the second processing chamber group 117 into the load lock chambers 14a and 14b.

Here, the configuration of the first processing chamber group 116 will be described. The first processing chamber group 116 and the second processing chamber group 117 have substantially the same structure. Consequently, here, only the first processing chamber group 116 will be described, and description regarding the second processing chamber group 117 will be omitted.

As shown in FIG. 1 to FIG. 3, two lower processing chambers 16a and 16b, that are adjacent to each other, are placed in the first processing chamber group 116. The lower processing chamber 16a and the lower processing chamber 16b are communicated with each other via a connecting space 48 disposed therebetween. When seen from the side of the carrying chamber 12, the lower processing chambers 16a and 16b are placed that they are lined up in tandem in the order of the lower processing chamber 16a and the lower processing chamber 16b. In the second processing chamber group 117 which has substantially the same structure as that of the first processing chamber group 116, a lower processing chamber 17a and a lower processing chamber 17b are lined up in tandem in order, when seen from the side of the carrying chamber 12. Additionally, when seen from above, the lower processing chambers 16a and 16b and the lower processing chambers 17a and 17b are placed such that a straight line joining together the centers of the lower processing chambers 16a and 16b and a straight line joining together the centers of the lower processing chambers 17a and 17b become substantially parallel to each other (see FIG. 1).

Substrate holding tables 36a and 36b are respectively disposed in the lower processing chambers 16a and 16b. The substrate holding tables 36a and 36b each have independent structures and are situated in one row in the same direction as the wafer processing flow direction, when seen from the apparatus overall. Namely, the substrate holding table 36b is placed on the far side of the substrate holding table 36a when seen from the carrying chamber 12. The wafers 1 mounted on the substrate holding tables 36a and 36b are heated by heaters 37a and 37b that serve as heating components built into the substrate holding tables 36a and 36b, and the wafers 1 are heated to a temperature of 300° C., for example. The substrate holding tables 36a and 36b are formed by a metal material with excellent thermal conductivity (e.g., aluminium such as A5052 or A5056).

A substrate carrier 40 is disposed in the connecting space 48 between the lower processing chamber 16a and the lower processing chamber 16b (see FIG. 1). The substrate carrier 40 receives one of the two unprocessed wafers 1 that have been carried by the robot 30 in the carrying chamber 12 from the tweezers of the robot 30, and transfers the wafer 1 onto the substrate holding table 36b. Moreover, the substrate carrier 40 transfers the processed wafer 1 on the substrate holding table 36b onto the tweezers of the robot 30.

Further, upper processing chambers 45a and 45b are disposed on the upper side of the lower processing chambers 16a and 16b to respectively lie on top of the lower processing chambers 16a and 16b. Namely, two upper processing chambers 45a and 45b that are adjacent to each other are placed on the upper side of the lower processing chambers 16a and 16b, like the lower processing chambers 16a and 16b.

Because of this placement, a processing chamber 116a is configured by the upper processing chamber 45a and the lower processing chamber 16a, a processing chamber 116b is configured by the upper processing chamber 45b and the lower processing chamber 16b, and the first processing chamber group 116 is configured by the processing chamber 116a and the processing chamber 116b.

Here, the upper processing chamber 45b and the lower processing chamber 16b that configure the processing chamber 116b will be described in detail. The upper processing chamber 45a and the lower processing chamber 16a that configure the processing chamber 116a also have substantially the same structure. Consequently, here, only the processing chamber 116b will be described, and description regarding the processing chamber 116a will be omitted.

As shown in FIG. 4, the upper processing chamber 45b is equipped with a reaction tube 52 that is formed in a cylindrical shape by quartz, for example. The reaction tube 52 is disposed upright, airtightly via an O-ring 92b, on the lower processing chamber 16b that is an airtight container made of metal. The upper end of the reaction tube 52 is airtightly blocked by a reaction tube ceiling plate 55. Accordingly, the reaction tube 52 configures a vacuum container. A gas introducing portion 44b and a gas introducing opening 56 are disposed in the substantially central portion of the reaction tube ceiling plate 55. The gas introducing opening 56 is connected to a process gas supply source (not shown in the drawings), and a process gas whose flow rate has been adjusted is supplied into the reaction tube 52. Further, a baffle plate 57 made of quartz that disperses the introduced gas is disposed inside the reaction tube 52. A high-frequency coil 54 for generating plasma is disposed around the periphery of the reaction tube 52, and the high-frequency coil 54 is covered by a coil cover 53. A high-frequency power source 59 is connected to the high-frequency coil 54, and a high-frequency electrical current for generating plasma is configured to be supplied to the high-frequency coil 54 by the high-frequency power source 59.

As has already been described, the substrate holding table 36b is fixed and disposed in the lower processing chamber 16b positioned under the upper processing chamber 45b. Further, a raising/lowering shaft 65 that is capable of being raised and lowered is placed in, so as to airtightly penetrate, the bottom portion of the lower processing chamber 16b. The raising/lowering shaft 65 is coupled to a raising/lowering substrate 64 placed in the lower processing chamber 16b. At least three substrate holding pins 39b that penetrate the substrate holding table 36b are disposed upright on the raising/lowering substrate 64. Because of this configuration, in the lower processing chamber 16b, the raising/lowering substrate 64 and the substrate holding pins 39b can be raised and lowered as a result of the raising/lowering shaft 65 being raised and lowered by the control of the controller 84. Further, the wafer 1 that has been mounted on the upper surfaces of the substrate holding pins 39b is mounted on the upper surface of the substrate holding table 36b or is lifted up from the substrate holding table 36b.

In the processing chamber 116b, the reaction tube 52 in the upper processing chamber 45b forms a plasma generating chamber 51. The wafer 1 on the substrate holding table 36b in the lower processing chamber 16b is processed by the plasma that has been generated in the plasma generating chamber 51. An exhaust opening 66 is formed in the bottom portion of the lower processing chamber 16b, and the processed gas is exhausted to the outside of the lower processing chamber 16b from the exhaust opening 66.

(2) Operations of Substrate Processing Apparatus

Next, the operations of the substrate processing apparatus 10 according to the present exemplary embodiment will be described.

The unprocessed wafers 1 are transferred from the EFEM 18 into the load lock chamber 14a, and when the load lock chamber 14a is airtightly blocked, the gate valve (not shown in the drawings) between the load lock chamber 14a and the carrying chamber 12 is opened. When the load lock chamber 14a and the carrying chamber 12 become communicated with each other, the robot 30 in the carrying chamber 12 takes, onto the upper tweezers 32a and onto the lower tweezers 32b, the wafers 1 that are held by the substrate support body 20 in the load lock chamber 14a. Then, the robot 30 carries the two wafers 1 it has taken onto the tweezers 32a and 32b into either the first processing chamber group 116 or the second processing chamber group 117 that is in a communicated state. For example, when the robot 30 has carried the two wafers 1 into the first processing chamber group 116, one of the two wafers 1 that have been simultaneously carried is mounted on the substrate holding table 36a in the lower processing chamber 16a. Together therewith, the other wafer 1 is transferred from the robot 30 and are mounted on the substrate holding table 36*b* in the lower processing chamber 16*b* by the substrate carrier 40.

Thereafter, when the reaction tubes 52 in the processing chambers 116*a* and 116*b* become airtightly blocked, the wafers 1 on the substrate holding tables 36*a* and 36*b* are heated by the heaters 37*a* and 37*b*, the process gas is introduced into the reaction tubes 52 from the gas introducing openings 56, and the high-frequency electrical current is applied to the high-frequency coils 54. Accordingly, in the plasma generating chambers 51 configured by the reaction tubes 52, plasma is generated and the wafers 1 are processed by the activated process gas. Here, a treatment to remove photoresists left on the wafers 1 is performed.

When processing in the plasma generating chambers 51 ends, the gate valve 35 separating the carrying chamber 12 from the first processing chamber group 116 is opened. Next, the robot 30 in the carrying chamber 12 inserts the tweezers 32*a* and 32*b* into the first processing group 116 and takes the two processed wafers 1. Namely, the robot 30 takes onto the tweezers 32*a* the processed wafer 1 on the substrate holding table 36*a* in the lower processing chamber 16*a*, and also takes onto the tweezers 32*b*, via the substrate carrier 40, the processed wafer 1 on the substrate holding table 36*b* in the lower processing chamber 16*b*. Then, the robot 30 rotates about its axis of rotation and swivels the processed wafers 1 and the tweezers 32*a* and 32*b*. Next, the robot 30 transfers the two processed wafers 1 that have been placed on the tweezers 32*a* and 32*b* onto the empty substrate support body 20 in the load lock chamber 14*b*. The processed wafers 1 that have reached a high temperature after processing are cooled to a predetermined temperature in the load lock chamber 14*b*.

The above processing operations are repeated, and when the substrate support body 20 in the load lock chamber 14*b* receives a predetermined number of the processed wafers 1, the gate valve (not shown in the drawings) between the load lock chamber 14*b* and the carrying chamber 12 is blocked, and the load lock chamber 14*b* is opened to the atmosphere. Thereafter, the processed wafers 1 are transferred from the load lock chamber 14*b* to the EFEM 18, and are carried outside by an outside carrying device (not shown in the drawings).

The substrate processing apparatus 10 according to the present exemplary embodiment performs the above processing operations. Consequently, in a case where the substrate processing apparatus 10 is used in a semiconductor device manufacturing process, a substrate supplying step, a processing step, and a substrate discharging step are sequentially executed. In the substrate supplying step, the robot 30 carries the wafers 1 into the processing chamber groups 116 and 117. In the processing step, the wafers 1 are processed in the processing chamber groups 116 and 117. In the substrate discharging step, the robot 30 carries the wafers 1 out from the processing chamber groups 116 and 117. Additionally, in at least one of the substrate supplying step and the substrate discharging step, as described below, supported surfaces of the wafers 1 that are carrying subjects are supported by the tweezers 32*a* and 32*b* of the robot 30.

(3) Configuration of Carrying Device

Figure 5:
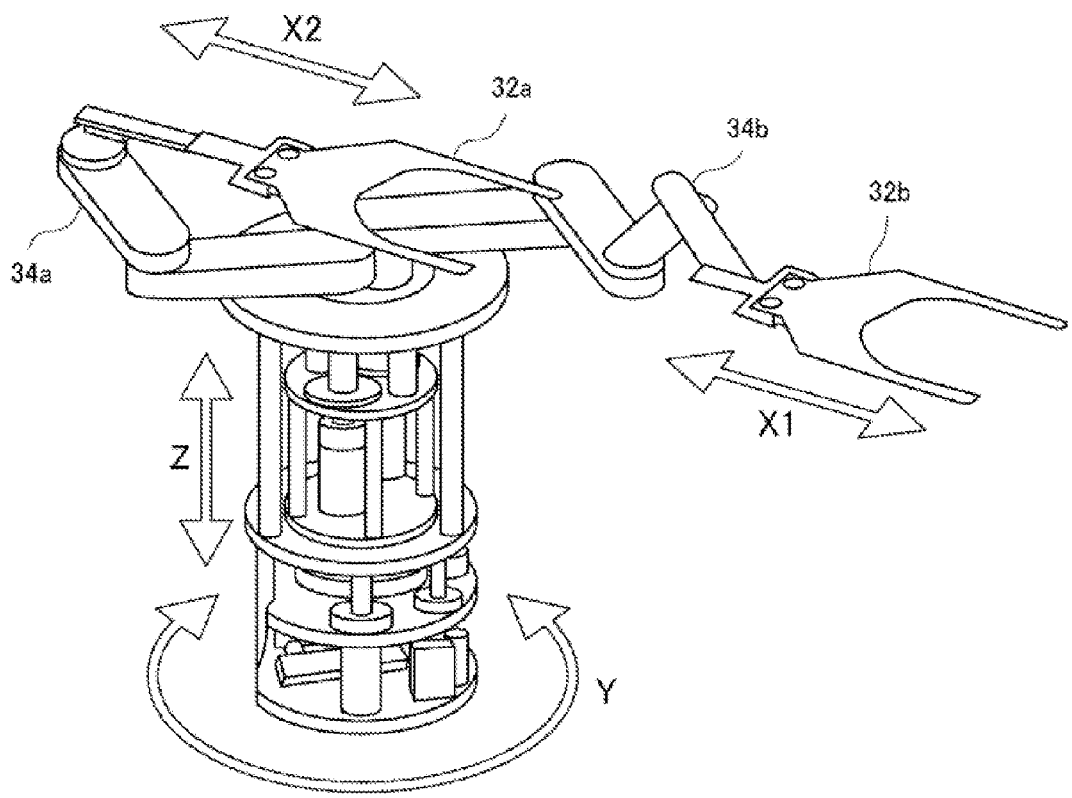
FIG. 5 is a schematic configuration diagram of a carrying device according to the exemplary embodiment of the present invention.

Next, an example configuration of the robot 30 that is a carrying device disposed in the carrying chamber 12 will be described. FIG. 5 is a schematic configuration diagram of the carrying device according to the exemplary embodiment of the present invention.

As shown in FIG. 5, the robot 30 that is a carrying device is equipped with a pair of arms 34*a* and 34*b* as carrying mechanism moving members. The arms 34*a* and 34*b* are configured such that each can separately move in the horizontal direction (the direction of X1 and X2 in FIG. 5), can move rotationally in the direction of Y in FIG. 5, and can move up and down in the direction of Z in FIG. 5.

The upper tweezers 32*a* are disposed on the distal end of the arm 34*a* as the substrate carrying mechanism 32 that supports the wafers 1 in a horizontal posture. Further, the lower tweezers 32*b* are similarly disposed on the distal end of the arm 34*b* as the substrate carrying mechanism 32. The upper tweezers 32*a* and the lower tweezers 32*b* have the same shape and are spaced with a predetermined interval apart from each other in the vertical direction. The arms 34*a* and 34*b* are placed such that they can individually move without interfering with each other. Namely, the arms 34*a* and 34*b* can move separately without interfering with each other in a state in which the upper tweezers 32*a* are positioned on the upper side and the lower tweezers 32*b* are positioned on the lower side.

(4) Configuration of Substrate Carrying Mechanism

Next, an example configuration of the substrate carrying mechanism 32 will be described. Here, because the upper tweezers 32*a* and the lower tweezers 32*b* have the same configuration, these will be simply generically called "tweezers" and described below focusing on one of these.

(Configuration of Conventional Tweezers)

Figure 6:
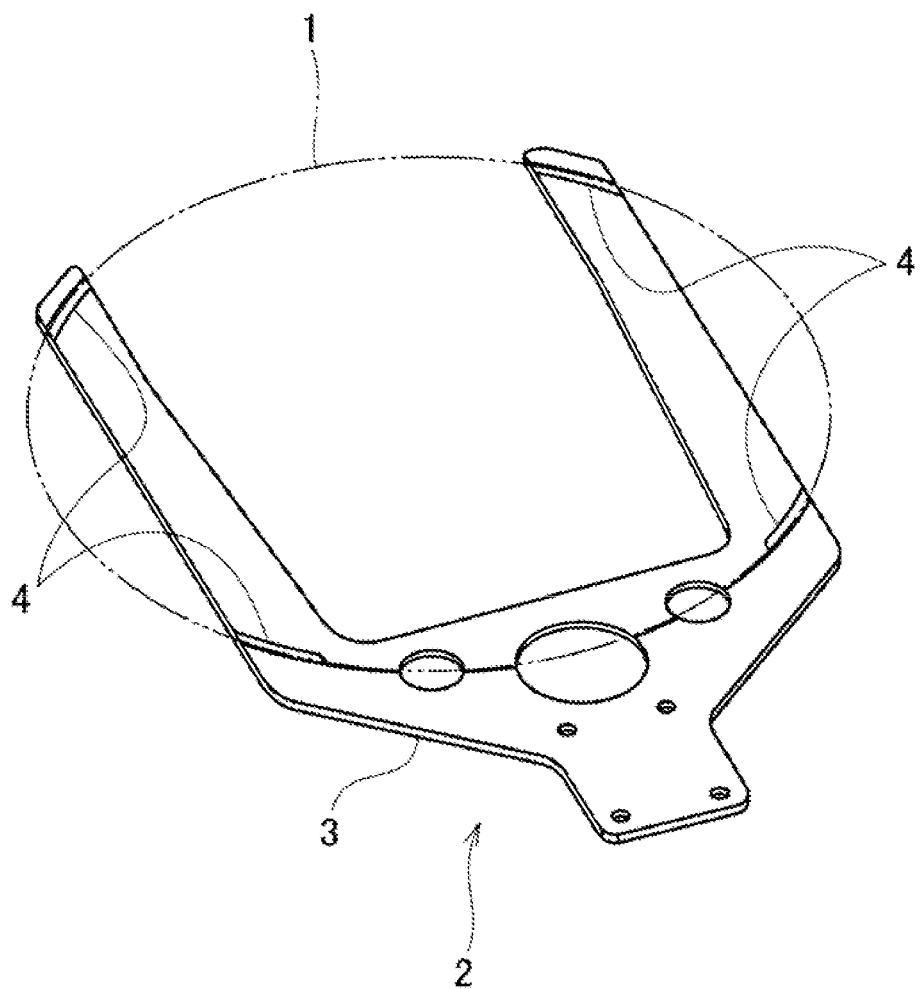
FIG. 6 is a perspective view showing an example of tweezers of a conventional configuration.
Figure 7A:
FIG. 7A is a diagram showing a specific example of a state in which deformation has occurred in a wafer in the tweezers shown in FIG. 6.
Figure 7B:
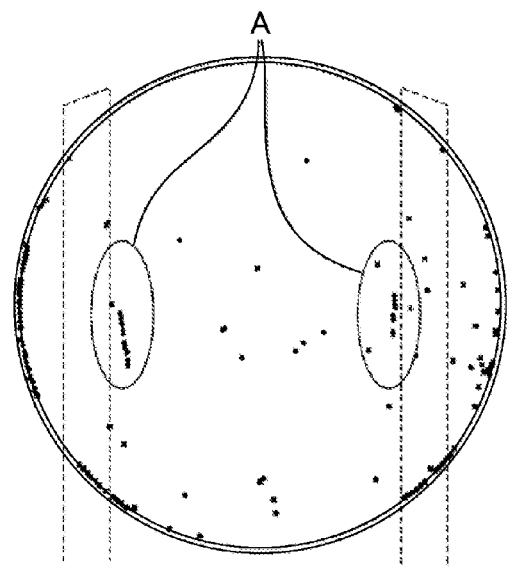
FIG. 7B is a diagram showing a specific example of a state of particle generation in the tweezers shown in FIG. 6.
Figure 7C:
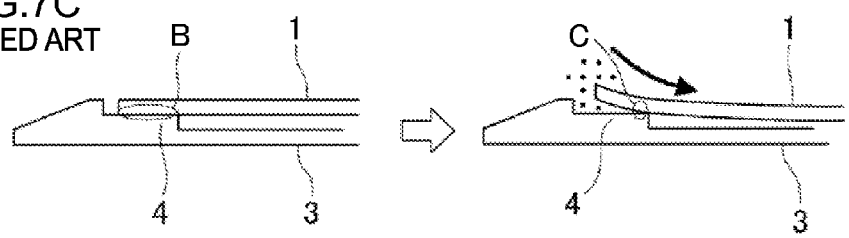
FIG. 7C is a diagram showing another specific example of a state in which deformation has occurred in the wafer in the tweezers shown in FIG. 6.

Here, prior to describing the tweezers 32*a* and 32*b* of the present exemplary embodiment, tweezers of a conventional configuration will be described, serving as a target of comparison with the tweezers of the present exemplary embodiment. FIG. 6 is a perspective view showing an example of tweezers of a conventional configuration. FIG. 7A to FIG. 7C are explanatory diagrams showing states of wafer support of the tweezers shown in FIG. 6.

As shown in FIG. 6, tweezers 2 support a wafer 1 that is a φ300 mm disc-shaped substrate, for example, and are configured to have a finger plate 3 that is a two-pronged fork-like plate-like body. Support portions 4 that project stepwise from the upper surface of the finger plate 3 toward the wafer 1 are formed on the finger plate 3. The support portions 4 are placed in positions in four places that are symmetric to the center of the wafer 1. The support portions 4 placed in these four places are configured such that they support four places in the neighboring portions of the outer peripheral edge of the wafer 1, by touching the back surface (the surface on the opposite side of the surface that undergoes processing) of the wafer 1. The touching between the wafer 1 and the support portions 4 takes place in a region on the inner peripheral side about 2 mm to about 3 mm from the outer peripheral edge of the wafer 1. Generally, this regional portion is not used at the time of product configuration, and this regional portion is regarded as a place that may not be so much affected by, for example, the generation of scratches and the adhesion of foreign matter.

The wafer 1 that is the carrying subject is formed using silicon (Si) as a base material, and when processing involving heating is performed, deformation such as warping and bending occur due to generated temperature distribution in the front to back surface or within the surface of the wafer 1.

For example, when the deformation as shown in FIG. 7A has occurred in the wafer 1, in the tweezers 2 in which the support portions 4 support four places in the neighboring portions of the outer peripheral edge of the wafer 1, and if the bending amount of the wafer 1 exceeds a fixed amount (approximately 1 mm), the wafer 1 may contact the upper surface of the finger plate 3. This kind of contact, as shown in FIG. 7B, may lead to the generation of scratches and particles, particularly at places (see portions A in FIG. 7B) in the neighboring portions of the edges of the finger plate 3. Further, for example, when the deformation as shown in FIG. 7C occur in the wafer 1, the substrate holding force of the support portions 4 (frictional force between the wafer 1 and the support portions 4) decreases (see portion B and portion C in FIG. 7C) compared to a case where the deformation has not occurred. Accordingly, it becomes easier for scratches and particles to be generated because of rubbing between the wafer 1 and the support portions 4, and particles that have been generated on the back surface (lower surface) side in the neighboring portions of the outer peripheral edge of the wafer 1 may drift up toward the front surface (upper surface) side and may adhere on the wafer 1. Moreover, when the substrate holding force decreases, the carrying speed must be controlled in order to prevent the wafer 1 from slipping, and the carrying capability of the wafer 1 (that is, the processing capability per unit time of the substrate processing apparatus 10) may also decrease.

Such scratches and particles become one of the factors that lower the manufacturing yield of products configured using the wafers 1, and therefore their generation should be suppressed as much as possible. Further, a decrease in carrying capability of the wafers 1 leads to a decrease in the production efficiency of the substrate processing apparatus 10 and may affect the semiconductor device manufacturing process.

(Configuration of Tweezers of Present Exemplary Embodiment)

Figure 8:
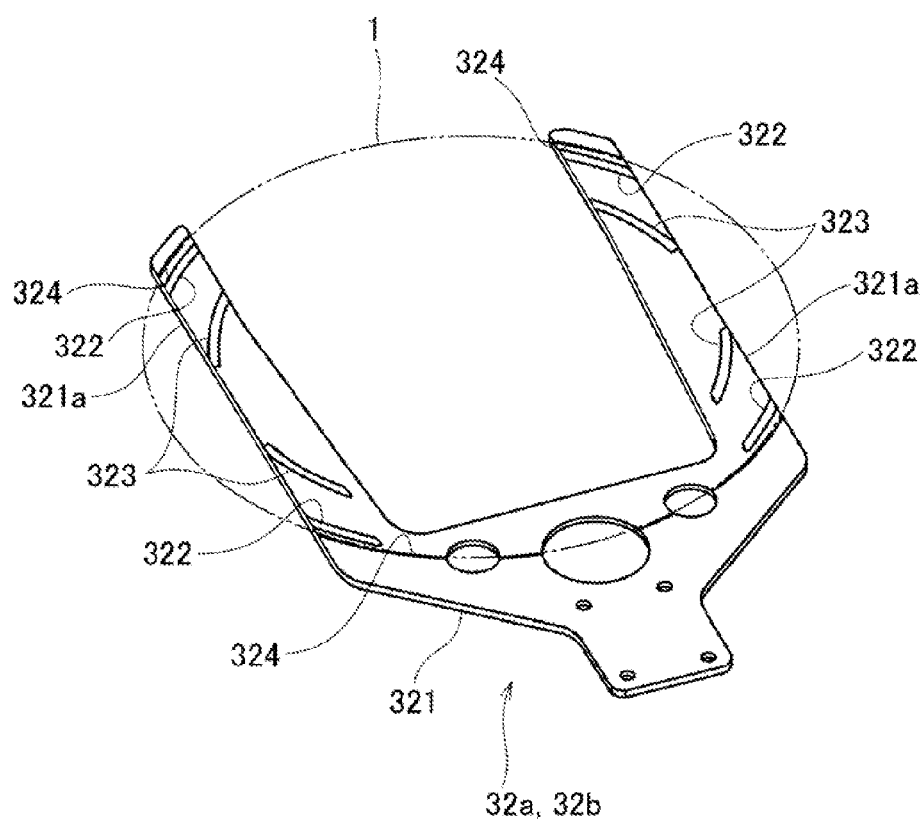
FIG. 8 is a perspective view showing an example of a substrate carrying mechanism (tweezers) according to the exemplary embodiment of the present invention.
Figure 9A:
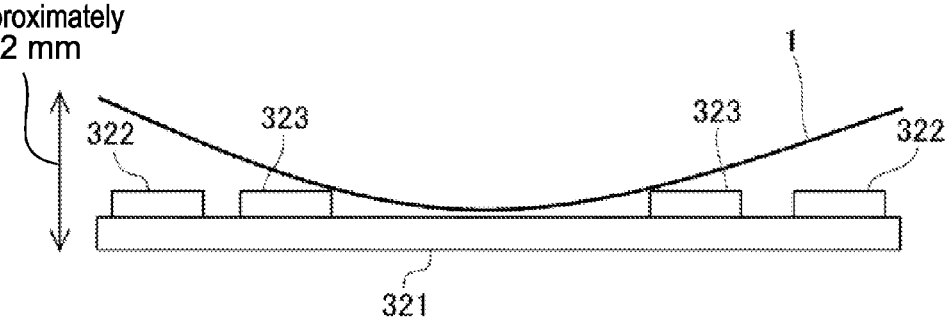
FIG. 9A is a diagram showing a specific example of a state in which deformation has occurred in the wafer in the tweezers shown in FIG. 8.
Figure 9B:
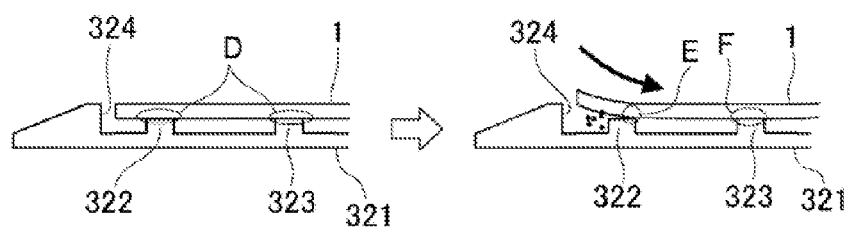
FIG. 9B is a diagram showing another specific example of a state in which deformation has occurred in the wafer in the tweezers shown in FIG. 8.

The tweezers 32a and 32b in the present exemplary embodiment are configured as described below. FIG. 8 is a perspective view showing an example of a substrate carrying mechanism (tweezers) according to the exemplary embodiment of the present invention. FIG. 9A and FIG. 9B are explanatory diagrams showing states where a wafer is supported on the tweezers shown in FIG. 8.

(Finger Plate)

As shown in FIG. 8, the tweezers 32a and 32b are configured to include a finger plate 321 that is a support base body that supports a wafer 1 that is a φ300 mm disc-shaped substrate, for example. The finger plate 321 is a two-pronged fork-like plate-like body whose central portion is cut out. The finger plate 321 is formed in a two-pronged fork having a pair of band-shaped portions 321a, and is formed by, for example, an oxide ceramic material (an alumina ceramic, etc.). The band-shaped portions 321a are placed to overlap part of the wafer 1 when the tweezers 32a and 32b are supporting the wafer 1, and the distal ends of the band-shaped portions 321a extend as far as positions on the outer side of the outer peripheral edge of the wafer 1.

Substrate support portions, in which plural convex portions disposed on a surface of the finger plate 32 are placed on a circumference of a circle that is smaller than the diameter of the wafer 1, are disposed on the finger plate 321. Namely, first support portions 322 and second support portions 323 are formed on the finger plate 321 inside a region surrounded by guide side walls 324. The first support portions 322 comprise plural convex portions that project from the upper surface of the finger plate 321 toward the wafer 1. The second support portions 323 comprise plural convex portions that are placed in positions differing from those of the first support portions 322. The substrate support portions according to the present exemplary embodiment are configured mainly by the first support portions 322 and the second support portions 323. The first support portions 322 and the second support portions 323 are both formed by the same material as the finger plate 321, and are configured to support the wafer 1 as a result of their projecting top surfaces touching the back surface (the surface on the opposite side of the surface that undergoes processing) of the wafer 1.

(First Support Portions)

The first support portions 322 are placed in a circular state on the surface of the finger plate 321. Here, "circular state" means existing on positions that form a circumference of a circle (the first support portions 322 do not necessarily need to exist continuously across the entire circumference of the circle) and includes a case where the first support portions 322 exist dispersed with intervals on those positions. Moreover, the first support portions 322 are placed in positions whose distance from a center of the surface of the wafer 1 is fixed when the tweezers 32a and 32b are supporting the wafer 1. This means that the first support portions 322 are positioned on one circumference of a circle on the surface of the finger plate 321, and that the center of that circle and the center of the surface of the wafer 1 coincide.

Further, the first support portions 322 are placed to be dispersed on one circumference of a circle on the surface of the finger plate 321 in plural places in which they equally support the wafer 1. Examples of plural places capable of equal support include plural places that become point symmetric when the center of the surface of the wafer 1 is taken as a basis, and plural places that become line symmetric (plural places that are bilaterally symmetric, etc.) when a line segment passing through the center of the wafer 1 is taken as a basis. More specifically, the first support portions 322 are placed to be dispersed, on one circumference of a circle on the surface of the finger plate 32, in four places that are spaced apart from each other on the circle. Because of this dispersed placement in four places, four of the first support portions 322 exist on one circumference of a circle, and the first support portions 322 equally support four places in the neighboring portions of the outer peripheral edge of the wafer 1. First support positions of the wafer 1 are configured by these four first support portions 322. Here, dispersed placement in four places is taken as an example, but the number of places in which the first support portions is dispersed is not limited to this. The dispersed placement may also be realizable with dispersed placement in less than four places or in five or more places. Of the plural convex portions configuring the first support portions 322, the convex portions located in symmetric positions are configured such that their support areas of the wafer 1 are mutually equal.

The size of the circumference of the circle on which the first support portions 322 exist is set on the basis of the size of the wafer 1 in its radial direction. Namely, the distance from the center of the circumference of the circle and the wafer 1 to the first support portions 322 (that is, the radius of the circumference of the circle on which the first support portions 322 are placed) is set on the basis of the distance between the center and the outer peripheral edge of the wafer 1 (that is, the radius of the wafer 1 that is a disc-shaped substrate). Preferably, in order for the neighboring portions of the outer peripheral edge of the wafer 1 to be supported by the first support portions 322, the distance to the first support portions 322 is set as large as possible in a range that does not exceed the radius of the wafer 1.

However, when the above distance is to be set as large as possible, it is necessary to take the following points into consideration. The first support portions 322 are not placed in positions that coincide with the outer peripheral edge of the wafer 1, but are placed in positions at the inner peripheral side with predetermined distance from the outer peripheral edge. Namely, the first support portions 322 are formed to support not the outer peripheral edge of the wafer 1 but the inner side of the outer peripheral edge in the neighboring portions of the outer peripheral edge of the wafer 1. Specifically, the first support portions 322 are formed such that their projecting portions that project from the surface of the finger plate 321 are continuous in the circumferential direction in positions on the inner peripheral side about 3 mm to about 5 min from the outer peripheral edge of the wafer 1, and have flat (when seen in a cross-sectional view), and arc-shaped (when seen in a perspective view), top surfaces. Accordingly, concave portions whose bottom surfaces coincide with the upper surface of the finger plate 321 are formed between the first support portions 322 and the guide side walls 324.

Because of the above, if the outer diameter of the wafer 1 is φ300 mm, for example, the size of the circumference of the circle, on which the first support portions 322 exist, is set such that the outer peripheral side of the projecting portions of the first support portions 322 is about φ290 mm to about φ294 mm and the inner peripheral side of the projecting portions of the first support portions 322 is about φ280 mm to about φ284 mm.

(Second Support Portions)

The second support portions 323 are placed in positions differing from the positions of the first support portions 322 on the surface of the finger plate 32. More specifically, the second support portions 323 are placed inside the circumference of the first support portions 322 (that is, on the inner side of the circumference of the circle on which the first support portions 322 exist). Like the first support portions 322, the second support portions 323 are also placed in a circular state on the surface of the finger plate 321. Moreover, the second support portions 323 are placed in positions whose distance from the center of the surface of the wafer 1 is fixed when the tweezers 32a and 32b are supporting the wafer 1. This means that the first support portions 322 and the second support portions 323 are placed on concentric circles on the surface of the finger plate 321. Here, "concentric circles" means two or more circles that share a center. Consequently, because the first support portions 322 and the second support portions 323 are placed on concentric circles, the second support portions 323 are positioned on one circumference of a circle whose radius differs from that of the circumference of the circle on which the first support portions 322 are placed, and the second support portions 323 are placed in positions in which the interval between the second support portions 323 and the first support portions 322 is fixed.

Further, like the first support portions 322, the second support portions 323 are also placed to be dispersed in plural places in which they equally support the wafer 1 on one circumference of a circle (on a circumference of a circle that is concentric with, but has a different diameter than that of, the circumference of the circle on which the first support portions 322 are placed) on the surface of the finger plate 321. Moreover, like the first support portions 322, the second support portions 323 are also placed to be dispersed in four places that are spaced apart from each other on the circumference of the circle. Because of these four second support portions 323, second support positions of the wafer 1 are configured. And like the first support portions 322, the second support portions 323 are also not limited to four places. The dispersed placement is also realizable by dispersed placement in less than four places or in five or more places. Further, of the plural convex portions configuring the second support portions 323, the convex portions located in symmetric positions are configured such that their support areas of the wafer 1 are mutually equal.

The size of the circumference of the circle, on which the second support portions 323 exist, is set on the basis of the size of the circumference of the circle on which the first support portions 322 exist, and the planar shape of the finger plate 321. Preferably, the second support portions 323 are set in positions that satisfy the following particulars. First, the circumference of the circle on which the second support portions 323 exist is a circumference of a circle that is concentric with, but has a different diameter than that of, the circumference of the circle on which the first support portions 322 exist. Second, the second support portions 323 are set in positions in which they can be placed at the innermost peripheral side (that is, the side farthest away from the first support portions 322) in a range that satisfies restrictions when forming the second support portions 323 on the upper surfaces of the band-shaped portions 321a of the finger plate 321. It is suitable for the interval between the first support portions 322 and the second support portions 323 to be large in terms of obtaining effects described below.

However, regarding the positions of the second support portions 323, it is necessary to satisfy the following restrictions in placing the second support portions 323 at the innermost peripheral side. The second support portions 323 are placed to be dispersed substantially equally in four places on the finger plate 321, with two of the second support portions 323 existing on one of the band-shaped portions 321a of the finger plate 321 and with the remaining two second support portions 323 existing on the other of the band-shaped portions 321a. For this reason, on each of the band-shaped portions 321a, two of the second support portions 323 are placed to be spaced apart from each other. This requires that the size of the circumference of the circle on which the second support portions 323 exists is a size with which an interval for the above spacing can be ensured. This is the content of a first restriction.

Further, on each of the band-shaped portions 321a, for reasons described below, it is preferred that the second support portions 323 be placed to be continuous across the entire width of that band-shaped portion 321a. Namely, on each of the band-shaped portions 321a, at least one of the two second support portions 323 on that band-shaped portion 321a (e.g., the second support portion 323 positioned on the distal end side of the band-shaped portion 321a) is placed continuously from one edge position of that band-shaped portion 321a to the other edge position. It is preferred that the second support portions 323 to exist on a circumference of a circle of a size capable of such placement. This is the content of a second restriction.

In light of the content of the first and second restrictions described above and an allowable amount of deformation of the wafer 1 described below, if the outer diameter of the wafer 1 is φ300 mm, for example, the size of the circumference of the circle on which the second support portions 323 exist is set in such a way that the inner peripheral side of the projecting portions of the second support portions 323 is about φ230 mm and the outer peripheral side of the projecting portions of the second support portions 323 is about φ240 mm.

(Guide Side Walls)

A circular arc-shaped guide side wall 324 corresponding to the outer peripheral shape of the wafer 1 is disposed on the distal end portion of each of the band-shaped portions 321a. A circular arc-shaped guide side wall 324 corresponding to the outer peripheral shape of the wafer 1 is also disposed in the finger plate 321 on the side opposing the distal end portions of the band-shaped portions 321a (that is, the root side of the tweezers 32a and 32b). These guide side walls 324 are formed higher than the convex portions configuring the first support portions 322 and the second support portions 323.

(Functions of Tweezers of Present Exemplary Embodiment)

The tweezers 32a and 32b in the present exemplary embodiment support the wafer 1 with the substrate support portions that are placed on circumference of circle (Namely, the first support portions 322 and the second support portions 323 that are placed on concentric circles). Accordingly, the wafer 1 may be supported with good reproducibility regardless to the direction of deformation of the wafer 1. As described above, the wafer 1 deforms as a result of being heated, and the direction of deformation of the wafer 1 differs depending on the characteristics of the wafer 1, and the placement and types of circuits formed on the wafer 1. Therefore, if the substrate support portions are not placed on a circumference of a circle (e.g., in parallel lines or in a quadrilateral shape), the amount of posture fluctuations and height fluctuations in the wafer 1 ends up changing greatly, depending on the direction of deformation of the wafer 1. According to the present exemplary embodiment, the substrate support portions are placed on circumference of circles. Accordingly, the present exemplary embodiment may support the wafer 1 with good reproducibility regardless of the direction of deformation of the wafer 1. Namely, no matter which direction the wafer 1 deforms, the present exemplary embodiment may keep the amount of posture fluctuations and height fluctuations in the wafer 1 in a fixed range.

Further, in the present exemplary embodiment, because the substrate support portions (the first support portions 322 and the second support portions 323) are placed on circumference of circles, shifting of the wafer 1 at the time of carriage may be effectively suppressed. As described above, the arms 34 that move the tweezers 32a and 32b are configured to rotate about an axis of rotation extending in the vertical direction and move in the horizontal direction. Namely, a force works on the wafer 1 from every direction at the time of carriage. At this time, if the substrate support portions are not placed on a circumference of a circle (e.g., in parallel line shapes or in a quadrilateral shape), the force for holding the wafer 1 differs greatly depending on direction (e.g., holding force of rotational movement may become strong but holding force of horizontal movement may become weak, etc.). In the case of a structure where the substrate support portions are not placed on a circumference of a circle, the wafer 1 shifts on top of the tweezers 32a and 32b and may fall off and so forth. According to the present exemplary embodiment, the substrate support portions are placed on circumference of circles, so the force for holding the wafer 1 may be equalized regardless to the direction of carriage. Accordingly, the present exemplary embodiment may effectively suppress shifting of the wafer 1 at the time of carriage. Further, the present exemplary embodiment may increase the carrying speed of the wafers 1 and may improve the productivity of substrate processing.

Further, in the present exemplary embodiment, the plural convex portions configuring the first support portions 322 are placed to be line symmetric on the basis of the center of the surface of the wafer 1 or line symmetric on the basis of a line segment passing through the center of the wafer 1. Further, similarly, the plural convex portions configuring the second support portions 323 are placed to be line symmetric on the basis of the center of the surface of the wafer 1 or line symmetric on the basis of a line segment passing through the center of the wafer 1. Accordingly, the present exemplary embodiment may equalize the force for holding the wafer 1 regardless to the direction of carriage. As a result, the present exemplary embodiment may effectively suppress shifting of the wafer 1 at the time of carriage. In a case where the convex portions are not placed symmetric, the force with which the wafer 1 may differ depending on the direction of carriage. As a result, when the wafer 1 has been rotationally or horizontally moved, the wafer 1 shifts on top of the tweezers 32a and 32b and may fall off and so forth.

Further, in the present exemplary embodiment, out of the plural convex portions configuring the first support portions 32, the convex portions located in symmetric positions are configured such that their support areas of the wafer 1 are mutually equal. Further, the plural convex portions configuring the second support portions 323, the convex portions located in symmetric positions are also configured such that their support areas of the wafer 1 are mutually equal. Accordingly, the present exemplary embodiment may equalize the force for holding the wafer 1 regardless to the direction of carriage. Accordingly, the present exemplary embodiment may suppress shifting of the wafer 1 at the time of carriage. In a case where the convex portions located in symmetric positions are not configured such that their support areas of the wafer 1 are mutually equal, the force for holding the wafer 1 may differ greatly depending on the direction of carriage. As a result, at the time of carriage of the wafer 1, the wafer 1 shifts on top of the tweezers 32a and 32b and may fall off and so forth.

Further, the tweezers 32a and 32b of the present exemplary embodiment have the second support portions 323 in addition to the first support portions 322, and the top surfaces of the first support portions 322 and the second support portions 323 support the wafer 1 by touching the back surface (the surface on the opposite side of the surface that undergoes processing) of the wafer 1. Namely the wafer 1 is supported from its back surface side at both the first support positions resulting from the first support portions 322 and the second support positions resulting from the second support portions 323. Consequently, compared to the conventional configuration (the case of the configuration that supports only four places in the neighboring portions of the outer peripheral edge of the wafer 1), the present exemplary embodiment may disperse the load when supporting the wafer 1. Accordingly, the present exemplary embodiment may reduce the load in each support position, and may suppress scratches from forming and particles from being generated on the back surface of the wafer 1, due to the wafer 1 rubbing against the first support portions 322 and the second support portions 323.

Even if the wafer 1 is supported by the first support positions and the second support positions, the surface of the wafer 1 that undergoes processing is not affected since the back surface side of the wafer 1 is supported.

When the wafer 1 is supported by both the first support positions and the second support positions, an increase in the support area of the wafer 1 (that is, an increase in the substrate holding force (frictional force when supported) of the wafer 1) may be easily realized compared to the conventional configuration (the case of the configuration that supports only four places in the neighboring portions of the outer peripheral edge of the wafer 1) since the second support positions are disposed. On the other hand, the present exemplary embodiment may reduce the support areas of each of the first support portion 322 and the second support portion 323, and may reduce unnecessarily contacts of the wafer 1, without decreasing the overall substrate holding force, when compared to the conventional configuration.

The present exemplary embodiment may realize appropriate support of the wafer 1 regardless of the state of the wafer 1 since the load when supporting the wafer 1 is dispersed as described below (Namely, even when deformation has occurred in the wafer 1).

For example, when deformation as shown in FIG. 9A has occurred in the wafer 1, the second support portions 323 on the inner peripheral side of the first support portions 322 support the wafer 1. Consequently, the present exemplary embodiment may suppress the wafer 1 from contacting the upper surface of the finger plate 321, when compared to the case of supporting only the neighboring portions of the outer peripheral edge as in the conventional configuration. Specifically, in the conventional configuration, contact may occur if the bending amount of the wafer 1 exceeded about 1 mm. However, when the second support portions 323 are placed on a circumference of a circle of about φ230 mm with respect to φ300 mm wafer 1, for example, the present exemplary embodiment may increase the allowable amount of deformation to approximately 2 mm with respect to the bending of the wafer 1. In other words, to achieve the allowable amount of deformation approximately 2 mm in regard to φ300 mm wafer 1, it suffices to place the second support portions 323 on a circumference of a circle of about φ230 mm. Not only the second support portions 323 but also the first support portions 322 exist on the finger plate 321. Consequently, deformation where the neighboring portions of the outer peripheral edge of the wafer 1 drop downward also does not occur.

Further, for example, when deformation as shown in FIG. 9B occur in the wafer 1, the substrate holding force of the first support portions 322 (frictional force between the wafer 1 and the first support portions 322) may decrease (see portions D and portion E in FIG. 9B) compared to a case where this deformation does not occur. However, the substrate holding force of the second support portions 323 (frictional force between the wafer 1 and the second support portions 323) does decrease because the surface contact remains as is (see portions D and portion F in FIG. 9B). In other words, even when deformation has occurred in the wafer 1, several support positions remain in surface contact with the wafer 1 because of the dispersal of the support positions (the increase in the number of support places), and the present exemplary embodiment may avoid a situation where all of the support positions to be in line contact with the wafer 1. Consequently, the present exemplary embodiment may suppress a decrease in the substrate holding force of the wafer 1.

If a drop in the substrate holding force may be suppressed, it becomes unnecessary to lower the carrying speed in order to prevent the wafer 1 from slipping when the wafer 1 is carried in a supported state. Consequently, in the present exemplary embodiment, improving the carrying capability of the wafer 1 (that is, the processing capability per unit time in the substrate processing apparatus 10) becomes easily realizable compared to the conventional configuration. Specifically, carriage throughput, which becomes the basis of wafer processing capability, was 130 wph (number of wafers carried per unit time), for example, in the conventional configuration. On the other hand, in the present exemplary embodiment, it is possible to improve carriage throughput to 180 wph, for example. Further, in the present exemplary embodiment, the effect of particles on the wafer 1 is remedied compared to the conventional configuration. Consequently, the present exemplary embodiment may also suppress a return step in adjusting the carrying position at the time of startup.

Moreover, in the present exemplary embodiment, the concave portions are formed between the first support portions 322 and the guide side walls 324. Consequently, for example, when the deformation as shown in FIG. 9B has occurred in the wafer 1, even if particles are generated on the back surface (lower surface) side in the neighboring portions of the wafer edge, the generated particles are enclosed in the spaces configured by the concave portions and the wafer edge, and are suppressed from drifting up toward the front surface (upper surface) side. Namely, even when particles have been generated, the present exemplary embodiment may reduce the drifting of the particles onto the wafer 1 because the concave portions exist. It is appropriate for the positions of the first support portions 322 for forming these concave portions to be on the inner peripheral side about 3 mm to about 5 mm from the outer peripheral edge of the wafer 1. Accordingly, if these positions are too far on the inner peripheral side, a sufficient effect may not be obtained because of a decrease in stability.

The first support portions 322 of the present exemplary embodiment are formed to support not the outer peripheral edge (edge portion) of the wafer 1 but the inner side of the outer peripheral edge in the neighboring portions of the outer peripheral edge of the wafer 1. Namely, the first support portions 322 are configured not to contact the outer peripheral edge of the wafer 1. Accordingly, the present exemplary embodiment may effectively suppress the generation of particles in the neighboring portions of the wafer edge. In a previous substrate processing step (e.g., a CVD treatment step), the neighboring portions of the wafer edge is also formed with a thin film that is formed on the front surface of the wafer 1. Consequently, if the first support portions 322 contact the outer peripheral edge of the wafer 1, the thin film that has been formed may peel away, and the particles may be generated. Accordingly, in the present exemplary embodiment, the generation of particles may be effectively suppressed because the first support portions 322 do not contact the outer peripheral edge of the wafer 1.

According to the present exemplary embodiment, the adhesion of particles onto the wafer 1 carried by the lower tweezers 32b may be effectively suppressed. Namely, in a configuration where the two tweezers 32a and 32b are placed to be spaced with a predetermined interval from each other in the vertical direction, particles generated in the wafer 1 carried by the upper tweezers 32a may fall and accumulate on the wafer 1 carried by the lower tweezers 32b. Accordingly, in the present exemplary embodiment, the generation and diffusion of particles may be suppressed as described above. Accordingly, the present exemplary embodiment may suppress the adhesion of particles to the wafer 1 carried by the lower tweezers 32b and may improve the quality of substrate processing.

According to the present exemplary embodiment, the circular arc-shaped guide side walls 324 corresponding to the outer peripheral shape of the wafer 1 are disposed in the distal end portions of the band-shaped portions 321a and on the side opposing the distal end portions of the band-shaped portions 321a (that is, the root sides of the tweezers 32a and 32b). The guide side walls 324 are formed higher than the convex portions configuring the first support portions 322 and the second support portions 323. The guide side walls 324 function as guides when mounting the wafers 1 onto the tweezers 32a and 32b. Further, the guide side walls 324 function to prevent the wafers 1 from shifting and falling at the time of carriage.

The structure for attaching the tweezers 32a and 32b of the present exemplary embodiment to the arms 34a and 34b may be the same structure as in the conventional configuration. Accordingly, the tweezers 32a and 32b of the present exemplary embodiment may be applied to existing substrate processing apparatus used in semiconductor device manufacturing processes, without requiring any significant change. Thus, the tweezers 32a and 32b of the present exemplary embodiment may be effective for improving the capability of those substrate processing apparatus.

(5) Effects of Present Exemplary Embodiment

According to the present exemplary embodiment, one or several effects described below may be provided.

According to the present exemplary embodiment, the substrate support portions (the first support portions 322 and the second support portions 323) are placed on a circumference of a circle. Accordingly, the present exemplary embodiment may support the wafer 1 with good reproducibility, regardless to the direction of deformation of the wafer 1. Namely, the present exemplary embodiment may keep the amount of posture fluctuations and height fluctuations of the wafer 1 in a fixed range, no matter which direction the wafer 1 deforms. Further, because the substrate support portions (the first support portions 322 and the second support portions 323) are placed on a circumference of a circle, the present exemplary embodiment may equalize the force to hold the wafer 1 regardless to the direction of the carriage. Accordingly, the present exemplary embodiment may suppress shifting of the wafer 1 at the time of carriage, and may increase the carrying speed of the wafer 1 and improve the productivity of substrate processing.

Further, according to the present exemplary embodiments, the plural convex portions configuring the first support portions 322 and the second support portions 323 are placed to be point symmetric on the basis of the center of the surface of the wafer 1, or line symmetric on the basis of a line segment passing through the center of the wafer 1. Accordingly, the present exemplary embodiment may equalize the force for holding the wafer 1 regardless to the direction of carriage. Additionally, the present exemplary embodiment may suppress shifting of the wafer 1 at the time of carriage, and may increase the carrying speed of the wafer 1 and improve the productivity of substrate processing.

Further, according to the present exemplary embodiment, the convex portions located in symmetric positions out of the plural convex portions configuring the first support portions 322 and the second support portions 323, are configured such that their support areas of the wafer 1 are mutually equal. Accordingly, the present exemplary embodiment may further equalize the force for holding the wafer 1 regardless to the direction of carriage. Additionally, the present exemplary embodiment may suppress shifting of the wafer 1 at the time of carriage and may increase the carrying speed of the wafer 1 and improve the productivity of substrate processing.

Further, in the tweezers 32a and 32b according to the present exemplary embodiment, the second support portions 323 are placed on the finger plate 321 inside the circumference of the first support portions 322, and therefore, the load when supporting the wafer 1 is dispersed. Accordingly, the present exemplary embodiment may suppress the wafer 1 from contacting the finger plate 321 even when deformation has occurred in the wafer 1. Further, the present exemplary embodiment may also suppress rubbing and so forth caused by a decrease in the substrate holding force of the wafer 1. Consequently, the present exemplary embodiment may suppress scratches and particles from being generated in the wafer 1 and therefore eliminate one of the factors that lower the manufacturing yield of products configured using the wafer 1. Moreover, because the present exemplary embodiment may suppress a drop in the substrate holding force due to deformation of the wafer 1, the present embodiment may realize stable high-speed carriage when carrying the wafer 1, and may avoid a decrease in production efficiency in the substrate processing apparatus 10 and adversely affecting the semiconductor device manufacturing process.

Further, in the tweezers 32a and 32b according to the present exemplary embodiment, the first support portions 322 and the second support portions 323 are placed on concentric circles. Consequently, the present exemplary embodiment may appropriately cope even when the deformation generated in the wafer 1 is unique to a disc-shaped substrate. Specifically, for example, even when the deformation as shown in FIG. 9A has occurred, the wafer 1 may be invariably supported by the second support portions 323. Consequently, because of this placement on concentric circles, the present exemplary embodiment may support the wafer 1 that is a disc-shaped substrate, may reliably suppress scratches and particles from being generated in the wafer 1, and may reliably suppress the substrate holding force of the wafer 1 from decreasing.

In particular, as described in the present exemplary embodiment, when the first support portions 322 and the second support portions 323 have been placed to be dispersed in plural places in which they equally support the wafer 1, and more specifically when the first support portions 322 and the second support portions 323 have been placed to be dispersed in four places that are spaced apart from each other on circumference of circles, the load when supporting the wafer 1 is equally dispersed to each of the first support portions 322 and the second support portions 323. Consequently, the present exemplary embodiment may suppress, not only the generation of scratches and particles, but also deformation of the wafer 1 itself due to the equal dispersion of the load. In the present exemplary embodiment, a case in which both the first support portions 322 and the second support portions 323 are placed to be dispersed equally, has been described. However, at least one of the first support portions 322 and the second support portions 323 may be placed to be equally dispersed. In such case, equal dispersion of the support load of the wafer 1 may also be obtained.

Moreover, in the present exemplary embodiment, the first support portions 322 and the second support portions 323 are each placed in positions whose distance from the center of the surface of the wafer 1 is fixed, and the interval between the first support portions 322 and the second support portions 323 is fixed. Namely, the first support portions 322 and the second support portions 323 are placed on concentric circles having centers that coincide with the center of the surface of the wafer 1. Accordingly, by making the centers of the concentric circles on which the first support portions 322 and the second support portions 323 exist coincide with the center of the surface of the wafer 1, the effect resulting from the equal dispersion of the support load described above becomes even more reliable. In that case, if the distance from the center of the surface of the wafer 1 to the first support portions 322 is set on the basis of the distance between the center of the surface and the outer peripheral edge of the wafer 1, placing the first support portions 322 as close as possible to the outer peripheral edge becomes realizable. Consequently, the first support portions 322 reliably support the neighboring portions of the outer peripheral edge of the wafer 1. Further, if the distance from the center of the surface of the wafer 1 to the second support portions 323 is set to a size that is farthest away from the first support portions 322 in a range that satisfies restrictions when placing the second support portions 323 on the band-shaped portions 321a of the finger plate 321, increasing the interval between the first support portions 322 and the second support portions 323 as much as possible becomes realizable. If the interval between the first support portions 322 and the second support portions 323 is set large, the dispersion of the support load of the wafer 1 suitably takes place, and may increase the allowable amount of deformation of the wafer 1, and may suppress decrease in the substrate holding force.

Further, in the tweezers 32a and 32b according to the present exemplary embodiment, the first support portions 322 are formed continuous in the circumferential direction in positions on the inner peripheral side a predetermined distance from the outer peripheral edge of the wafer 1, and the concave portions are formed between the first support portions 322 and the guide side walls 324. Consequently, even if particles are generated on the back surface (lower surface) side in the neighboring portions of the outer peripheral edge of the wafer 1, the present exemplary embodiment may suppress the generated particles from drifting up toward the front surface (upper surface) side of the wafer 1, and may reduce the risk of particles being drift up onto the wafer 1.

Further, in the tweezers 32a and 32b according to the present exemplary embodiment, on each of the band-shaped portions 321a of the finger plate 321, at least one of the second support portions 323 is placed to be continuous across the entire width of that band-shaped portion 321a. Consequently, in both edge positions of the band-shaped portions 321a, the second support portions 323 that project from the surfaces of the band-shaped portions 321a invariably exist. Accordingly, the present exemplary embodiment may reliably avoid the wafer 1 to contact the edge positions of the band-shaped portions 321a, particularly in places in the neighboring portions of the edges, where scratches and particles are easily generated (see FIG. 7B). In the present exemplary embodiment, a case in which the finger plate 321 is a two-pronged fork and has the pair the band-shaped portions 321a, has been described. However, the number of the band-shaped portions 321a may also be only one or three or more. Even in such cases the generation of scratches and particles in places in the neighboring portions of the edges may be effectively suppressed, if the second support portions 323 are placed continuously across the entire width.

Further, the first support portions 322 of the present exemplary embodiment are formed to support, not the outer peripheral edge but, the inner side of the outer peripheral edge in the neighboring portions of the outer peripheral edge of the wafer 1. Namely, the first support portions 322 are configured not to contact the outer peripheral edge of the wafer 1 on which a thin film is formed. Accordingly, the present exemplary embodiment may effectively suppress the generation of particles.

Further, according to the present exemplary embodiment, the generation and diffusion of particles may be suppressed as described above. Accordingly, the present exemplary embodiment may effectively suppress particles generated in the wafer 1 carried by the upper tweezers 32a, for example, from adhering to the wafer 1 carried by the lower tweezers 32b, and may improve the quality of substrate processing.

Further, on the tweezers 32a and 32b of the present exemplary embodiment, the circular arc-shaped guide side walls 324 that are formed higher than the convex portions configuring the first support portions 322 and the second support portions 323 are disposed on the distal end portions and the root side of the band-shaped portions 321a. Accordingly, the present exemplary embodiment may guide (position) the wafer 1 mounted on the tweezers 32a and 32b, and may prevent the wafer 1 from shifting and falling at the time of carriage.

Further, according to the substrate processing apparatus 10 of the present exemplary embodiment, even when deformation occur in the wafer 1 when the robot 30 in the carrying chamber 12 carries the wafer 1, the generation of scratches and particles may be suppressed. Consequently, the substrate processing apparatus 10 according to the present exemplary embodiment may eliminate one of the factors that lowers the manufacturing yield of products configured using the wafer 1. Moreover, the substrate processing apparatus 10 according to the present exemplary embodiment may also suppress a decrease in the holding force of the wafer 1, and therefore high-speed carriage when carrying the wafer 1 becomes realizable.

By using the substrate processing apparatus 10 according to the present exemplary embodiment described above to manufacture a semiconductor device, the present exemplary embodiment may perform semiconductor device manufacturing with high efficiency.

Other Exemplary Embodiments of Present Invention

In the exemplary embodiment described above, a case in which the substrate processing apparatus 10 is an ashing apparatus, has been described. However, the present invention is not limited to thereto. Namely, the present invention may also be applied to apparatus that perform other processing, regardless of the processing content in the processing chamber. For example, the present invention may be applied to, a film-forming treatment, an etching treatment, a diffusion treatment, an oxidation treatment, a nitriding treatment, an annealing treatment, etc, as long as the apparatus performs substrate carriage with respect to that processing chamber.

Further, in the exemplary embodiment described above, a case in which the substrate that is the carrying subject is the wafer 1, has been described. However, the present invention is not limited thereto. Namely, the substrate that becomes the carrying subject in the present invention may also be a photomask, a printed wiring board, a liquid crystal panel, a compact disc, a magnetic disk, etc.

Further, in the exemplary embodiment described above, a case where the support positions of the substrate are placed on two concentric circles has been described. However, the present invention is also realizable in exactly the same way even in a case where, for example, the support positions of the substrate are placed on three or more concentric circles.

As described above, the present invention may be implemented in various configurations, and the technical scope of the present invention is not limited to the exemplary embodiment described above. For example, the configuration of the substrate processing apparatus 10 described in the exemplary embodiment above (e.g., the configurations of the processing chamber groups 116 and 117, etc.) are only specific examples and, it goes without saying, can be changed in various ways in a scope not departing from the gist thereof.

Preferred Aspects of the Present Invention

Preferred aspects of the present invention are appended below.

According to an aspect of the present invention, there is provided a substrate carrying mechanism including: a plate-like body that becomes a support base body of a substrate that is a carrying subject; first support portions that are placed in a circular state on a surface of the plate-like body and that supports the substrate; and second support portions that are placed inside the circumference of the first support portions on the surface and that supports the substrate.

Preferably, the first support portions and the second support portions are placed on concentric circles on the surface.

Further, preferably, at least one of the first support portions and the second support portions are placed to be dispersed in plural places in which they equally support the substrate.

Further, preferably, at least one of the first support portions and the second support portions are placed to be dispersed in four places that are spaced apart from each other on a circumference of a circle.

Further, preferably, the first support portions are placed in positions whose distance from a center of surface of the substrate is fixed.

Further, preferably, the distance from the center of surface to the first support portions is set on the basis of the distance between the center of surface and an outer peripheral edge of the substrate.

Further, preferably, the second support portions are placed in positions whose distance from a center of surface of the substrate is fixed.

Further, preferably, the distance from the center of surface to the second support portions is set to a size that is farthest away from the first support portions in a range that satisfies restrictions when placing the second support portions on the surface of the plate-like body.

Further, preferably, the first support portions and the second support portions are placed in positions in which the interval between the first support portions and the second support portions is fixed.

Further, preferably, the first support portions are formed such that projecting portions that project from the surface of the plate-like body are continuous in a circumferential direction in positions on the inner peripheral side a predetermined distance from an outer peripheral edge of the substrate, and such that the first support portions support the substrate at top surfaces of the projecting portions.

Further, preferably, the plate-like body has band-shaped portions that overlap part of the substrate, and the second support portions are placed to be continuous across the entire width of the band-shaped portions.

According to another aspect of the present invention, there is provided a substrate processing apparatus including: a load lock chamber that holds a substrate; a carrying chamber that is configured to be communicable with the load lock chamber; and a processing chamber that is configured to be communicable with the carrying chamber and that processes the substrate, wherein a carrying device that carries the substrate between the load lock chamber and the processing chamber is disposed inside the carrying chamber, the carrying device includes, a substrate carrying mechanism that supports the substrate, and a carrying mechanism moving member that moves the substrate carrying mechanism, the substrate carrying mechanism includes, a plate-like body that becomes a support base body of the substrate, first support portions that are disposed on a surface of the plate-like body and that supports the substrate, and second support portions that are disposed in positions differing from those of the first support portions on the surface and that supports the substrate, and the first support portions and the second support portions are placed on concentric circles on the surface.

According to still another aspect of the present invention, there is provided a semiconductor device manufacturing method that is performed using a substrate processing apparatus that includes a load lock chamber that holds a substrate, a carrying chamber that is configured to be communicable with the load lock chamber, and a processing chamber that is configured to be communicable with the carrying chamber and that processes the substrate, with a carrying device that carries the substrate between the load lock chamber and the processing chamber being disposed in the carrying chamber, the method including: a substrate supplying step in which the carrying device carries the substrate from the load lock chamber into the processing chamber; a processing step of processing the substrate in the processing chamber; and a substrate discharging step in which the carrying device carries the substrate out from the processing chamber and into the load lock chamber, wherein in at least one of the substrate supplying step and the substrate discharging step, a supported surface of the substrate that is a carrying subject is supported at both first support positions and second support positions that are placed on concentric circles in the surface.

According to still another aspect of the present invention, there is provided a substrate carrying mechanism including: a plate-like body that becomes a support base body of a substrate that is a carrying subject; and substrate support portions in which plural convex portions disposed on a surface of the plate-like body are placed on a circumference of a circle that is smaller than the diameter of the substrate.

According to still another aspect of the present invention, there is provided a substrate carrying mechanism including: a plate-like body that becomes a support base body of a substrate that is a carrying subject; first support portions in which plural convex portions are placed on a surface of the plate-like body; and second support portions in which plural convex portions are placed in positions differing from those of the first support portions on the surface, wherein the first support portions and the second support portions are placed on concentric circles on the surface.

Preferably, the substrate support portions are placed to support an inner side of an outer peripheral edge of the substrate.

Further, preferably, on the surface of the plate-like body, side walls that are formed higher than the convex portions configuring the substrate support portions are placed on the outer side of the substrate support portions.

Further, preferably, the plural convex portions configuring the substrate support portions are placed point symmetric on the basis of a center of surface of the substrate or line symmetric on the basis of a line segment passing through a center of the substrate, and out of the plural convex portions, the convex portions located in symmetric positions are configured such that their support areas of the substrate are mutually equal.

According to still another aspect of the present invention, there is provided a substrate processing apparatus including: a processing chamber that processes a substrate; and a carrying device that carries the substrate to the processing chamber, wherein the carrying device includes, a substrate carrying mechanism that supports the substrate, and a carrying mechanism moving member that moves the substrate carrying mechanism, and the carrying mechanism includes, a plate-like body that becomes a support base body of the substrate that is a carrying subject, and substrate support portions in which plural convex portions disposed on a surface of the plate-like body are placed on a circumference of a circle that is smaller than the diameter of the substrate.

Preferably, the substrate carrying mechanism includes a plurality of the plate-like bodies, and the plural plate-like bodies are placed to be spaced a predetermined interval apart from each other in a vertical direction.

Further, preferably, the carrying mechanism moving member is configured such that it may freely rotate about an axis of rotation extending in a vertical direction, and is configured such that it may freely move in a horizontal direction.

Further, preferably, the substrate processing apparatus further includes: a heating component that heats the substrate that has been carried into the processing chamber, the substrate carrying mechanism includes, first support portions in which plural convex portions are placed on a surface of the plate-like body, and second support portions in which plural convex portions are placed in positions differing from those of the first support portions on the surface, wherein the first support portions and the second support portions are placed on concentric circles on the surface.

Further, preferably, the plural convex portions configuring the substrate support portions are placed point symmetric on the basis of a center of surface of the substrate or line symmetric on the basis of a line segment passing through a center of the substrate, and out of the plural convex portions, the convex portions located in symmetric positions are configured such that their support areas of the substrate are mutually equal.

According to still another aspect of the present invention, there is provided a semiconductor device manufacturing method that is performed using a substrate processing apparatus configured to include, a processing chamber that processes a substrate, and a carrying device that carries the substrate to the processing chamber, the method including: a substrate supplying step in which the carrying device carries the substrate into the processing chamber; a processing step of processing the substrate in the processing chamber; and a substrate out-carrying step in which the carrying device carries the substrate out from the processing chamber, wherein in at least one of the substrate supplying step and the substrate out-carrying step, a supported surface of the substrate that is a carrying subject is supported by substrate support portions in which plural convex portions are placed on a circumference of a circle that is smaller than the diameter of the substrate.

According to still another aspect of the present invention, there is provided a semiconductor device manufacturing method that is performed using a substrate processing apparatus configured to include, a processing chamber that processes a substrate, and a carrying device that carries the substrate to the processing chamber, the method including: a substrate supplying step in which the carrying device carries the substrate into the processing chamber; a processing step of processing the substrate in the processing chamber; and a substrate out-carrying step in which the carrying device carries the substrate out from the processing chamber, wherein the substrate supplying step and the substrate out-carrying step each support, with plural plate-like bodies that are spaced a predetermined interval apart from each other in a vertical direction, the substrate that is a carrying subject, and in at least one of the substrate supplying step and the substrate out-carrying step, a supported surface of the substrate that is a carrying subject is supported by substrate support portions in which plural convex portions are placed on a circumference of a circle that is smaller than the diameter of the substrate on surfaces of the plate-like bodies.

What is claimed is:

1. A substrate carrying mechanism used in a carrying mechanism for carrying a substrate to a processing chamber that processes the substrate, the substrate carrying mechanism comprising:
   a plate-like body that becomes a support base body of a substrate that is carried;
   first support portions comprising plural projecting portions that are disposed bilaterally symmetric on a surface of the plate-like body and that support a region at an inner side with respect to an outer peripheral edge of the substrate, the first support portions being arc-shaped when seen in a perspective view and having top surfaces that are higher than the surface of the plate-like body when seen in a cross-sectional view;
   second support portions comprising plural projecting portions that are disposed at positions so as to support the substrate at an inner region with respect to positions of the first support portions on the surface, the second support portions being arc-shaped when seen in a perspective view and having top surfaces that are higher than the surface of the plate-like body when seen in a cross-sectional view,
   the first support portions and the second support portions being a same height and extending between the surface of the plate-like body and the substrate,
   the first support portions being spaced apart from each other on a circumference of a first circle that is concentric with the outer peripheral edge of the substrate, at positions that are closer, by a predetermined distance, to the center of the substrate than the outer peripheral edge of the substrate, and
   the second support portions being spaced apart from each other on a circumference of a second circle that is concentric with, and has a smaller diameter than that of, the first circle; and
   on the surface of the plate-like body, arc-shaped side walls that are formed higher than the first support portions and the second support portions, and that are disposed on the outer side of the first support portions with respect to a center of a surface of the substrate, so as to correspond to the first support portions, a recessed portion that extends lower than the top surfaces of the first support portions being disposed between each side wall and a corresponding one of the first support portions.

2. The substrate carrying mechanism according to claim 1, wherein:
   the plural projecting portions configuring the first support portions and the second support portions are point symmetric on the basis of the center of the surface of the substrate, or line symmetric on the basis of a line segment passing through the center of the surface of the substrate on the surface of the substrate, and
   out of the plural projecting portions, projecting portions located in symmetric positions are configured such that their support areas of the substrate are mutually equal.

3. The substrate carrying mechanism according to claim 1, wherein the plate-like body is a two-pronged fork-like plate-like body whose central portion is cut out, the central portion being between the two prongs and extending an entire length of the two prongs.

4. The substrate carrying mechanism according to claim 1, wherein the plate-like body is formed of a ceramic material.

5. The substrate carrying mechanism according to claim 1, wherein the first support portions are disposed on the surface of the plate-like body at positions from 3 mm to 5 mm inside of the outer peripheral edge of the substrate, when seen in a perspective view.

6. The substrate carrying mechanism according to claim 1, wherein:
   the first support portions are disposed at four positions that are spaced apart from each other on the circumference of the first circle; and
   the second support portions are disposed at four positions that are spaced apart from each other on the circumference of the second circle.

7. The substrate carrying mechanism according to claim 1, wherein a distance between each side wall and a corresponding one of the first support portions is shorter than a distance between the corresponding one of the first support portions and a corresponding one of the second support portions.

8. A substrate processing apparatus comprising:
   a processing chamber that processes a substrate; and
   a carrying device that carries the substrate to the processing chamber, the carrying device including:
      a substrate carrying mechanism that supports the substrate, and
      a carrying mechanism moving member that moves the substrate carrying mechanism, the carrying mechanism including:

a plate-like body that becomes a support base body of the substrate that is carried;

first support portions comprising plural projecting portions that are disposed bilaterally symmetric on a surface of the plate-like body and that support region at an inner side with respect to an outer peripheral edge of the substrate, the first support portions being arc-shaped when seen in a perspective view and having top surfaces that are higher than the surface of the plate-like body when seen in a cross-sectional view;

second support portions comprising plural projecting portions that are disposed at positions so as to support the substrate at an inner region with respect to those of the first support portions on the surface, the second support portions being arc-shaped when seen in a perspective view and having top surfaces that are higher than the surface of the plate-like body when seen in a cross-sectional view, the first support portions and the second support portions being a same height and extending between the surface of the plate-like body and the substrate, the first support portions being spaced apart from each other on a circumference of a first circle that is concentric with the outer peripheral edge of the substrate, at positions that are closer, by a predetermined distance, to the center of the substrate than the outer peripheral edge of the substrate, and the second support portions being spaced apart from each other on a circumference of a second circle that is concentric with, and has a smaller diameter than that of, the first circle; and on the surface of the plate-like body, arc-shaped side walls that are formed higher than the first support portions and the second support portions, and that are disposed on the outer side of the first support portions with respect to a center of a surface of the substrate, so as to correspond to the first support portions, a recessed portion that extends lower than the top surfaces of the first support portions being disposed between each side wall and a corresponding one of the first support portions.

9. The substrate processing apparatus according to claim 8, wherein the carrying mechanism moving member is configured such that it may freely rotate about an axis of rotation extending in a vertical direction and is configured such that it may freely move in a horizontal direction.

10. The substrate processing apparatus according to claim 8, wherein:

the plural projecting portions configuring the first support portions and the second support portions are point symmetric on the basis of the center of the surface of the substrate, or line symmetric on the basis of a line segment passing through the center of the surface of the substrate on the surface of the substrate; and out of the plural projecting portions, projecting portions located in symmetric positions are configured such that their support areas of the substrate are mutually equal.

11. The substrate processing apparatus according to claim 8, wherein the plate-like body is a two-pronged fork-like plate-like body whose central portion is cut out, the central portion being between the two prongs and extending an entire length of the two prongs.

12. The substrate processing apparatus according to claim 8, wherein the plate-like body is formed of a ceramic material.

13. The substrate processing apparatus according to claim 8, wherein the first support portions are disposed on the surface of the plate-like body at positions from 3 mm to 5 mm inside of the outer peripheral edge of the substrate, when seen in a perspective view.

14. The substrate processing apparatus according to claim 8, wherein:

the first support portions are disposed at four positions that are spaced apart from each other on the circumference of the first circle; and the second support portions are disposed at four positions that are spaced apart from each other on the circumference of the second circle.

* * * * *